(12) United States Patent
Sung et al.

(10) Patent No.: US 11,011,445 B2
(45) Date of Patent: May 18, 2021

(54) SEMICONDUCTOR PACKAGE DEVICE

(71) Applicant: Magnachip Semiconductor, Ltd., Cheongju-si (KR)

(72) Inventors: Moon Taek Sung, Sejong-si (KR); Jae Sik Choi, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 45 days.

(21) Appl. No.: 15/869,443

(22) Filed: Jan. 12, 2018

(65) Prior Publication Data

US 2018/0233424 A1    Aug. 16, 2018

(30) Foreign Application Priority Data

Feb. 15, 2017   (KR) .................. 10-2017-0020308

(51) Int. Cl.
*H01L 23/31* (2006.01)
*H01L 23/36* (2006.01)
(Continued)

(52) U.S. Cl.
CPC .......... *H01L 23/3107* (2013.01); *H01L 23/36* (2013.01); *H01L 23/3735* (2013.01); *H01L 23/4334* (2013.01); *H01L 23/49524* (2013.01); *H01L 23/49531* (2013.01); *H01L 23/49548* (2013.01); *H01L 23/49551* (2013.01); *H01L 23/49562* (2013.01); *H01L 23/49575* (2013.01); *H01L 24/37* (2013.01); *H01L 24/40* (2013.01); *H01L 24/48* (2013.01); *H01L 24/49* (2013.01); *H01L 24/73* (2013.01); *H01L 24/13* (2013.01); *H01L 24/16* (2013.01); *H01L 24/29* (2013.01); *H01L 24/32* (2013.01); *H01L 2224/1329* (2013.01); *H01L 2224/13111* (2013.01); *H01L 2224/13339* (2013.01); *H01L 2224/16225* (2013.01); *H01L 2224/2929* (2013.01); *H01L 2224/29111* (2013.01); *H01L 2224/29339* (2013.01); *H01L 2224/32245* (2013.01); *H01L 2224/73253* (2013.01);
(Continued)

(58) Field of Classification Search
None
See application file for complete search history.

(56) References Cited

U.S. PATENT DOCUMENTS 5,527,604 A * 6/1996 Hayashi ............... H01L 23/142
257/E23.006
5,577,617 A * 11/1996 Mojarradi ......... H01L 23/49575
174/536

(Continued)

FOREIGN PATENT DOCUMENTS

WO   WO 2009/017999 A2   2/2009

OTHER PUBLICATIONS

Im et al., U.S. Appl. No. 62/415,939, filed Nov. 1, 2016.*

*Primary Examiner* — Anthony Ho
*Assistant Examiner* — Kevin Quinto
(74) *Attorney, Agent, or Firm* — NSIP Law (57) ABSTRACT

A semiconductor package device includes a lead frame including a lead frame pad and lead frame leads, a semiconductor chip located on the lead frame pad, and a substrate located on the semiconductor chip, wherein the lead frame leads include first lead frame leads coupled to the lead frame pad and second lead frame leads separated from the lead frame pad and attached to a bottom surface of the substrate.

24 Claims, 12 Drawing Sheets

(51) Int. Cl.
*H01L 23/495* (2006.01)
*H01L 23/00* (2006.01)
*H01L 23/433* (2006.01)
*H01L 23/373* (2006.01)

(52) U.S. Cl.
CPC ............... *H01L 2924/13091* (2013.01); *H01L 2924/15747* (2013.01); *H01L 2924/181* (2013.01)

(56) References Cited

U.S. PATENT DOCUMENTS

| | | | |
|---|---|---|---|
| 2002/0060091 A1* | 5/2002 | Naba | H01L 23/15 174/257 |
| 2003/0025190 A1* | 2/2003 | Byun | H01L 23/49816 257/690 |
| 2003/0039102 A1* | 2/2003 | Yoshino | H01L 24/97 361/728 |
| 2006/0022328 A1* | 2/2006 | Lee | G06F 1/183 257/698 |
| 2007/0257343 A1* | 11/2007 | Hauenstein | H01L 25/072 257/676 |
| 2008/0174005 A1* | 7/2008 | Kubota | H01L 23/13 257/700 |
| 2009/0194855 A1* | 8/2009 | Liu | H01L 23/49551 257/666 |
| 2009/0212405 A1* | 8/2009 | Liu | H01L 23/49537 257/670 |
| 2018/0122725 A1* | 5/2018 | Im | H01L 23/3107 |

* cited by examiner

SEMICONDUCTOR PACKAGE DEVICE

CROSS-REFERENCE TO RELATED APPLICATIONS

This application claims the benefit under 35 USC 119(a) of Korean Patent Application No. 10-2017-0020308 filed on Feb. 15, 2017 in the Korean Intellectual Property Office, the entire disclosure of which is incorporated herein by reference for all purposes.

BACKGROUND

1. Field

The following description relates to a semiconductor package device. The following description also relates to a semiconductor package device having improved heat dissipation capabilities and low internal impedance.

2. Description of Related Art

Among semiconductor package devices, a surface-mount type package device is known that lends itself to ready attachment to a printed circuit board. Such a surface-mount type package device is usually manufactured through the processes of mounting a semiconductor chip on a lead frame, performing a wiring process, and encapsulating the chip with an epoxy molding compound (EMC). The lead frame is made of highly conductive materials such as copper (Cu), and the portions of the lead frame to be exposed to the exterior are plated with nickel (Ni), tin (Sn), and other similar materials for anti-oxidation and improved solder joint reliability. A wire for connecting the semiconductor chip to the lead frame may be made of a material such as gold (Au), aluminum (Al), and other similar materials In an alternative semiconductor package device, most of the heat produced by the semiconductor chip is discharged downward from the lead frame, and the residual heat is discharged upward from the semiconductor chip via the EMC. In this example, stray inductance is generated at the wires and the lead frame, which may adversely affect the performance of the chip. That is, the switching loss of the chip increases in proportion to a magnitude of the stray inductance generated in the manner discussed, above.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor package device includes a lead frame including a lead frame pad and lead frame leads, a semiconductor chip located on the lead frame pad, and a substrate located on the semiconductor chip, wherein the lead frame leads include first lead frame leads coupled to the lead frame pad and second lead frame leads separated from the lead frame pad and attached to a bottom surface of the substrate.

Each of the second lead frame leads may include a slanted portion and a bent portion, the slanted portion may be inclined at an angle with respect to the lead frame pad, and the bent portion may extend in a substantially parallel relationship to the bottom surface of the substrate and may be attached to the bottom surface of the substrate.

The lead frame pad may include electrically separated portions, semiconductor chips may be located respectively on the electrically separated portions of the lead frame pad, and one of the first lead frame leads may be connected to one of the second lead frame leads.

The angle at which the slanted portion is inclined may be proportional to a height of the semiconductor chip.

The angle at which the slanted portion is inclined may be an angle ranging from 10 degrees to 90 degrees.

The substrate may include a direct bonded copper (DBC) substrate including a first conductive layer, an insulating layer and a second conductive layer.

The insulating layer may be formed of either one or both of aluminum nitride (AlN) and aluminum oxide ($Al_2O_3$).

Either one or both of the first conductive layer and the second conductive layer may be formed of copper (Cu).

The device may further include a heat sink located on the substrate.

The device may further include a solder resist layer interposed between the semiconductor chip and the substrate.

The solder resist layer may be attached to the bottom surface of the substrate by a solder adhesive or a polymeric adhesive.

The polymeric adhesive may include a silver-epoxy (Ag-epoxy) adhesive.

The lead frame pad may be attached to the bottom surface of the semiconductor chip by a solder paste.

The bent portions of the second lead frame leads may be attached to the bottom surface of the substrate by a solder paste.

The solder resist layer may be formed using a photoimageable solder resist (PSR).

The device of claim 1 may further include a mold member surrounding the semiconductor chip and the substrate.

In another general aspect, a semiconductor package device includes a lead frame including a lead frame pad and lead frame leads, the lead frame pad including electrically separated portions, semiconductor chips located, respectively, on the electrically separated portions of the lead frame pad, and a substrate located on the semiconductor chips, wherein the lead frame leads include first lead frame leads coupled to the lead frame pad and second lead frame leads separated from the lead frame pad and attached to a bottom surface of the substrate, wherein each of the second lead frame leads includes a slanted portion and a bent portion, the slanted portion is inclined at an angle with respect to the lead frame pad, and the bent portion extends in a substantially parallel relationship to the bottom surface of the substrate and is attached to the bottom surface of the substrate, and wherein one of the first lead frame leads is connected to one of the second lead frame leads.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Examples are described in more detail below with reference to the appended drawings.

Examples disclosed herein are directed to a surface-mount type semiconductor package device that is formed by stacking a lead frame, a semiconductor chip, direct bond copper, and so on. Examples of the disclosed semiconductor package device have improved heat dissipation capabilities and low internal impedance, for example, low source-drain impedance in a power metal-oxide-semiconductor field-effect-transistor (MOSFET) and may be applied to a wide variety of applications, including an industrial power supply unit and pulse width modulation (PWM) type motor control.

Figure 1:
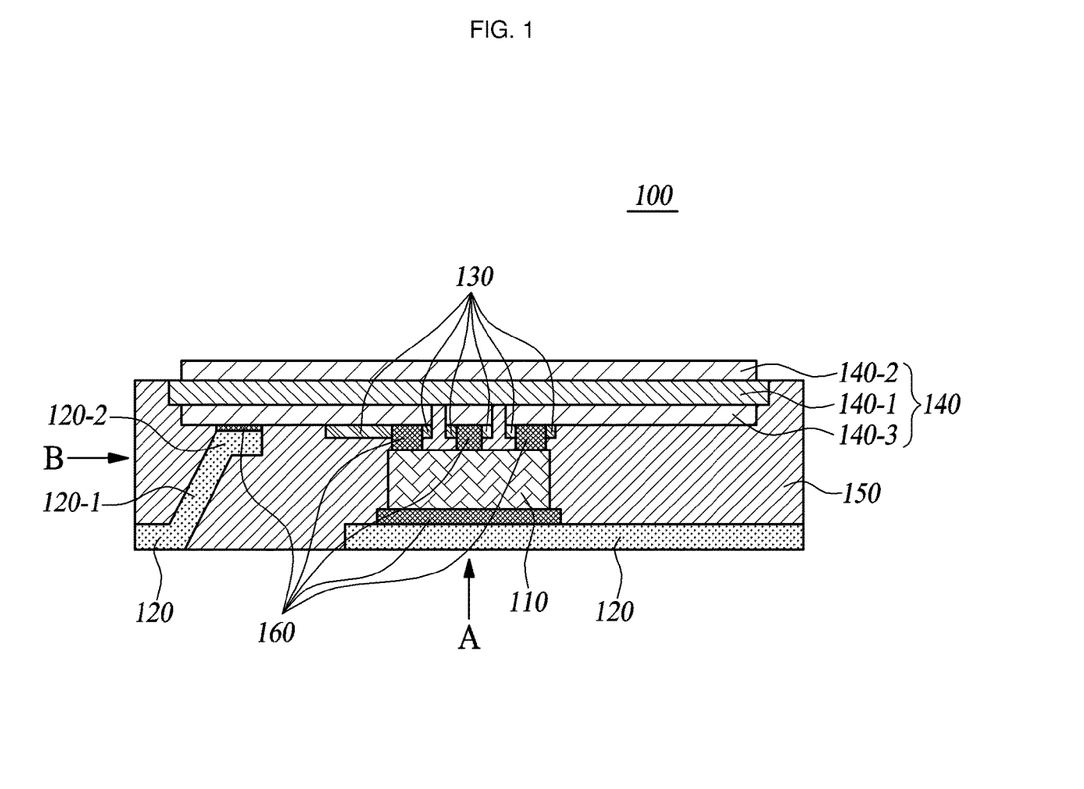
FIG. 1 is a view illustrating a semiconductor package device, according to an example.
Figure 2:
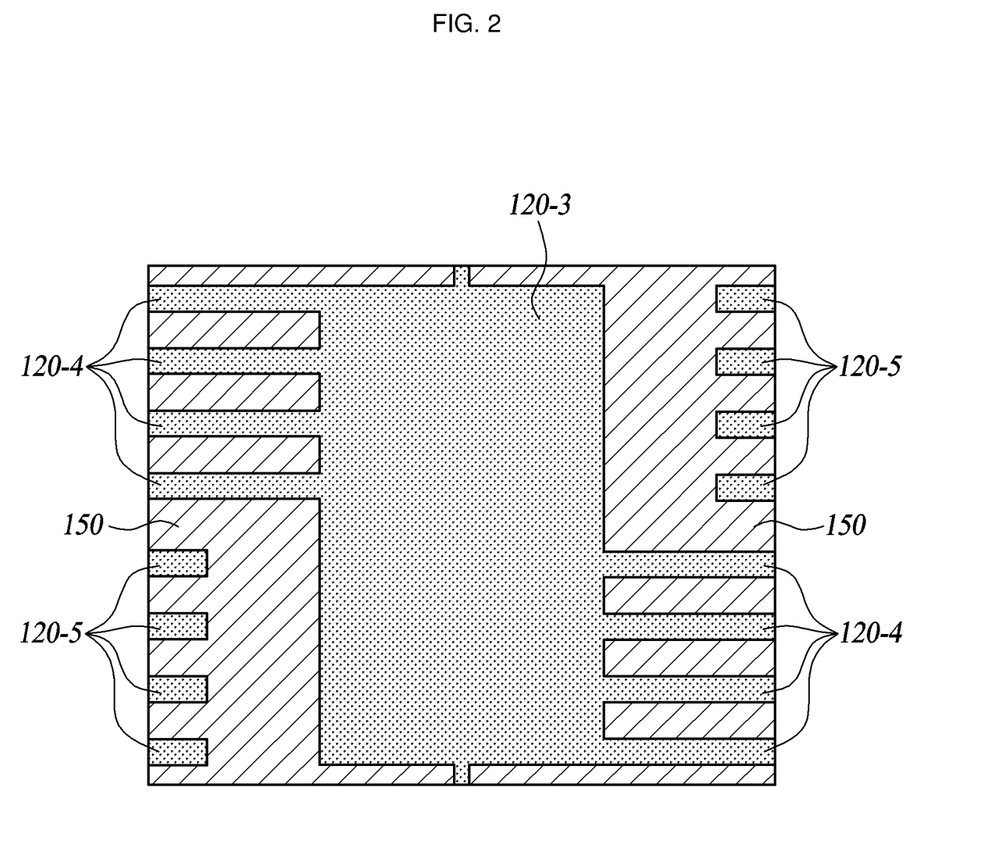
FIG. 2 is a view of the semiconductor package device of FIG. 1 viewed in a direction indicated by the arrow A in FIG. 1.

FIG. 1 is a view illustrating a semiconductor package device, according to an example. FIG. 2 is a view of the semiconductor package device of FIG. 1 viewed in a direction indicated by the arrow A in the example of FIG. 1. FIG.

Figure 3:
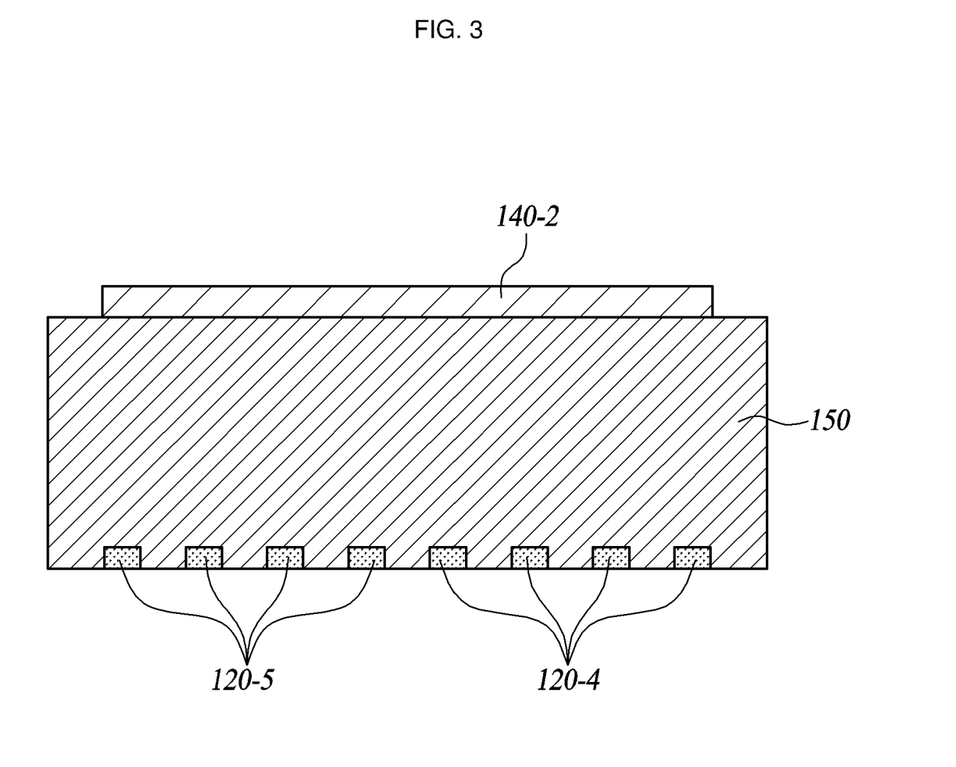
FIG. 3 is a view of the semiconductor package device of FIG. 1 viewed in a direction indicated by the arrow B in FIG. 1.

3 is a view of the semiconductor package device of the example of FIG. 1 viewed in a direction indicated by the arrow B in the example of FIG. 1.

As illustrated in the example of FIG. 1, the semiconductor package device 100 includes a lead frame 120, a semiconductor chip 110 located on the lead frame 120 and a substrate 140 located on the semiconductor chip 110 via a solder resist layer 130. The solder resist layer 130 acts to prevent an electrical short from occurring between the semiconductor chip 110 and the substrate 140. In an example, the solder resist layer 130 is formed using a photoimageable solder resist (PSR). However, the material for use in forming the solder resist layer 130 is not limited to being a PSR, but may be any kind of solder resist generally used in related technologies. Also, an example of the substrate 140 may include a direct bonded copper (DBC) substrate consisting of a first conductive layer 140-2, an insulating layer 140-1, and a second conductive layer 140-3. In an example, the insulating layer 140-1 is formed of a ceramic material such as aluminum nitride (AlN) or aluminum oxide ($Al_2O_3$). It is known that AlN and $Al_2O_3$ have superior properties with respect to thermal conductivity and dielectric strength, and thus may be used for heat dissipation and insulation purposes. The thermal conductivities of AlN and $Al_2O_3$ are 150 W/m*K and 32 W/m*K, respectively, and the dielectric strengths of AlN and $Al_2O_3$ are 20 KV/mm and 26 KV/mm, respectively. In an example, the first conductive layer 140-2 and the second conductive layer 140-3 are formed of copper (Cu). In an example, each of the first conductive layer 140-2, the insulating layer 140-1, and the second conductive layer 140-3 have a thickness ranging from about 0.1 mm to 0.5 mm.

Referring to the example of FIG. 2, the lead frame 120 includes a lead frame pad 120-3 on which the semiconductor chip 110 is to be located, first lead frame leads 120-4 coupled to the lead frame pad 120-3 and second lead frame leads 120-5 separated from the lead frame pad 120-3. In such an example, the lead frame 120 is formed of a material made of metal such as copper (Cu). Also, the first lead frame leads 120-4 are connected to a drain or a collector of the semiconductor chip 110. The second lead frame leads 120-5 may be connected to a source or an emitter or alternatively a gate or a base of the semiconductor chip 110. In this context, the second lead frame leads 120-5 are formed to be inclined at a predetermined angle, for example, an angle ranging from about 20 degrees to about 60 degrees. Referring back to the example of FIG. 1, each of the second lead frame leads 120-5 includes a slanted portion 120-1 and a bent portion 120-2. The slanted portion 120-1 is formed to be inclined at the predetermined angle with respect to the lead frame pad 120-3. Accordingly, the bent portion 120-2 is formed to extend in a substantially parallel relationship to a bottom surface of the substrate 140 for attachment to the substrate 140. For example, the predetermined angle at which the slanted portion 120-1 is inclined is determined to be proportional to a height of the semiconductor chip 110. That is, the predetermined angle is selected from among a range of possible angles from about 10 degrees to about 90 degrees in proportion to a height of the semiconductor chip 110. The attachment of the second lead frame leads 120-5 to the substrate 140 in a slanted manner provides the ability to eliminate the need for conventional wire bonding. Thus, a high degree of adaptability with respect to stock thickness of the semiconductor chip 110 is provided by allowing a slant angle of the second lead frame leads 120-5 to be adjusted based on a thickness of the semiconductor chip 110. For example, the slant angle of the second lead frame leads 120-5 is adjusted using an array jig capable of applying a load of about 50 grams to about 150 grams on top of the substrate 140. That is, after applying solder 160 onto the lead frame 120, locating the semiconductor chip 110 on the lead frame 120, and applying solder 160 again to facilitate attachment of the semiconductor chip 110 and the lead frame 120 to the substrate 140, the array jig is used to ensure a secure coupling between the semiconductor chip 110, the lead frame 120 and the substrate 140. In this example, care is to be taken not to make the substrate 140 tilted as well.

In the example of FIG. 1, the solder resist layer 130 is attached to the bottom surface of the substrate 140 by a solder adhesive or a polymeric adhesive. For example, the polymeric adhesive includes a silver-epoxy (Ag-epoxy) adhesive as an example of such an adhesive, although similar adhesives are also possible alternatives. A heat sink is attached to the top of the substrate 140 to facilitate heat dissipation. With the use of the solder 160, a rigid coupling structure is provided between the lead frame pad 120-3 and the bottom surface of the semiconductor chip 110, and between one end of each of the second lead frame leads 120-5 and the bottom surface of the substrate 140. In such an example, the semiconductor package device 100 further includes a mold member 150 surrounding the peripheries of the semiconductor chip 110 and the substrate 140. The mold member 150 provides the functions of protection and isolation for the semiconductor chip 110. Although the example of FIG. 3 illustrates the semiconductor package device 100 as having eight lead frame leads 120-4, 120-5 as the quantity of lead frame leads 120-4, 120-5, the number of the lead frame leads 120-4, 120-5 is not limited to 8 and may be more or fewer as needed.

Figure 4:
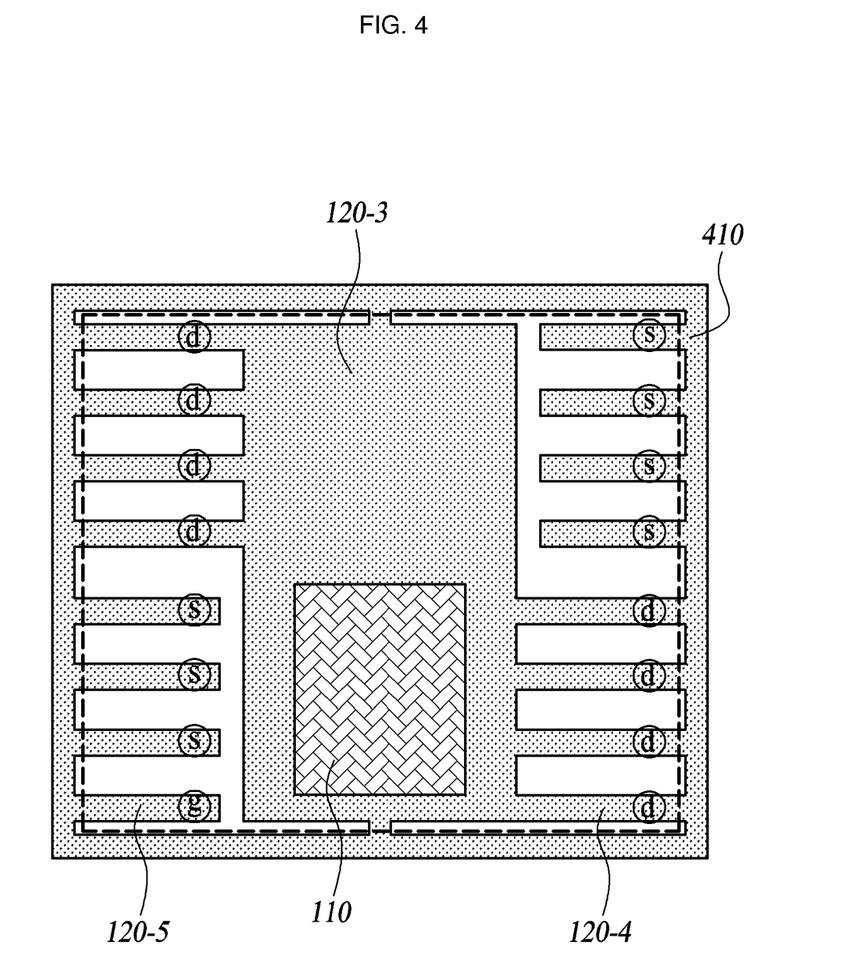
FIG. 4 is a view of the semiconductor package device having a single semiconductor chip located on a lead frame pad, according to an example.
Figure 5:
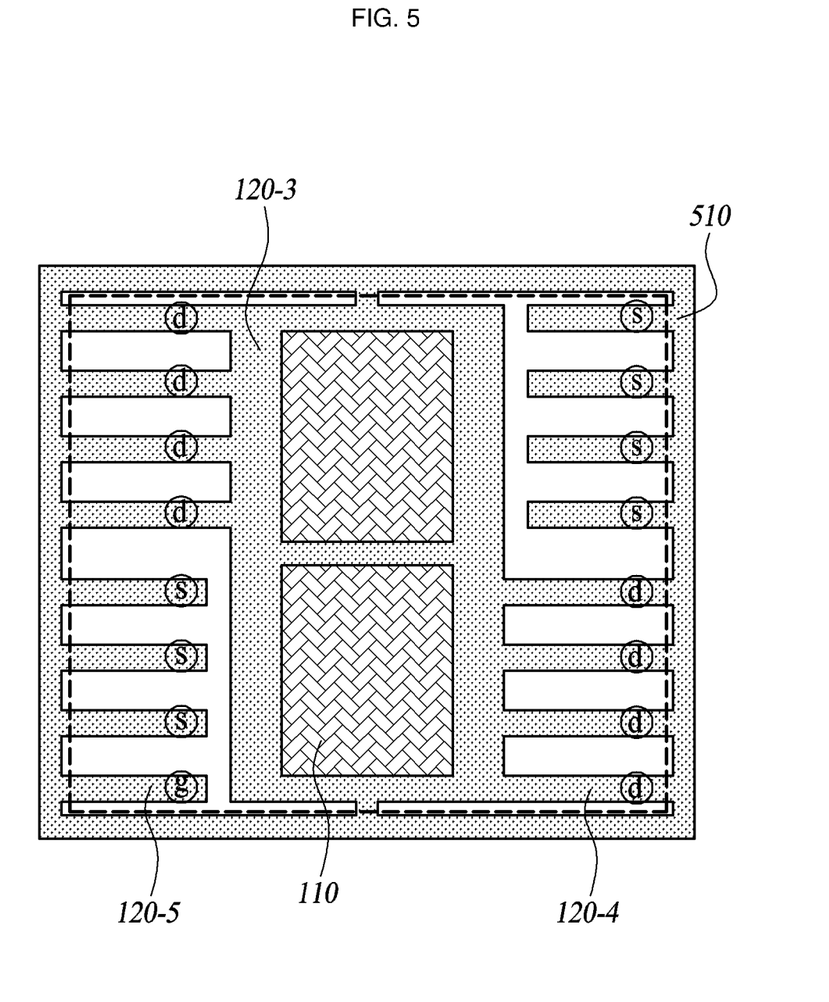
FIG. 5 is a view of the semiconductor package device having two semiconductor chips located on a lead frame pad, according to an example.
Figure 6:
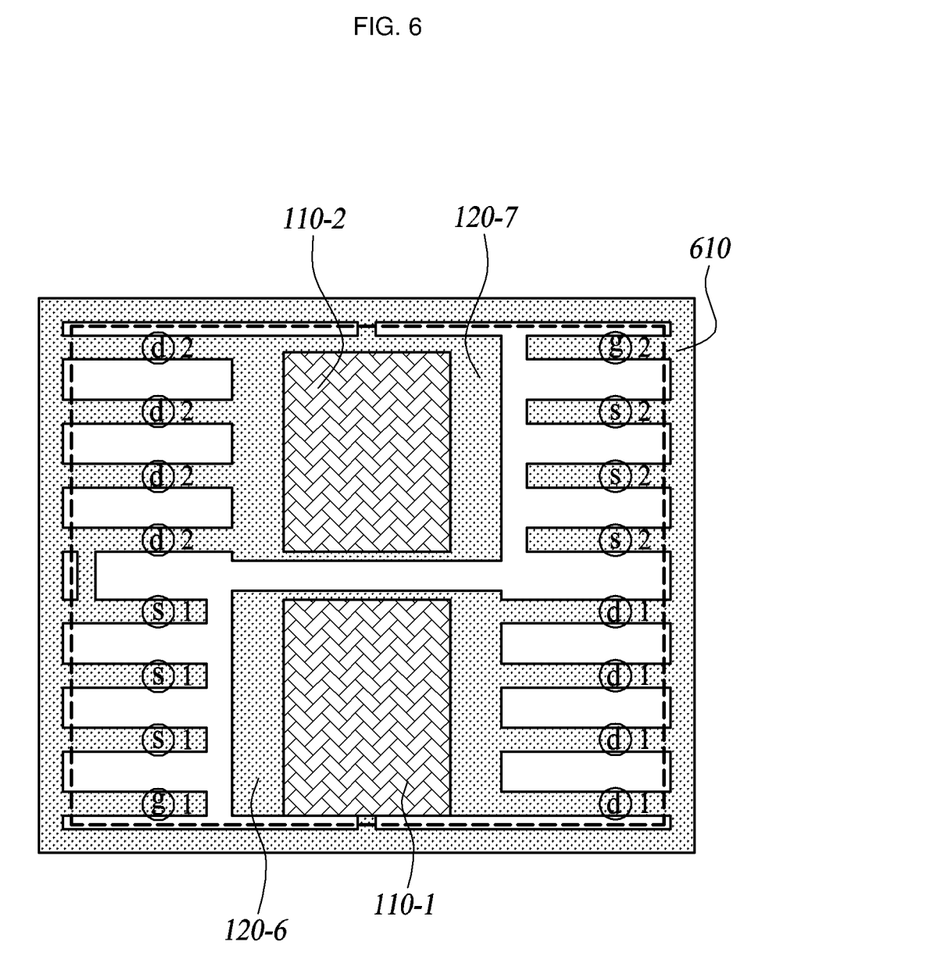
FIG. 6 is a view of the semiconductor package device where two semiconductor chips are located on a lead frame pad to form a half bridge circuit, according to an example.
Figure 7:
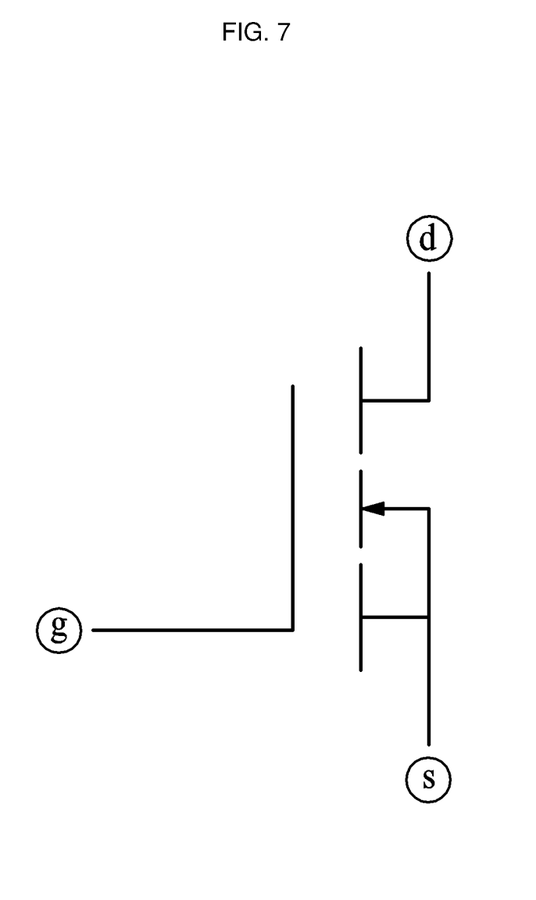
FIGS. 7 to 9 are views respectively illustrating equivalent circuits of the semiconductor package device structures shown in FIGS. 4 to 6, according to examples.
Figure 8:
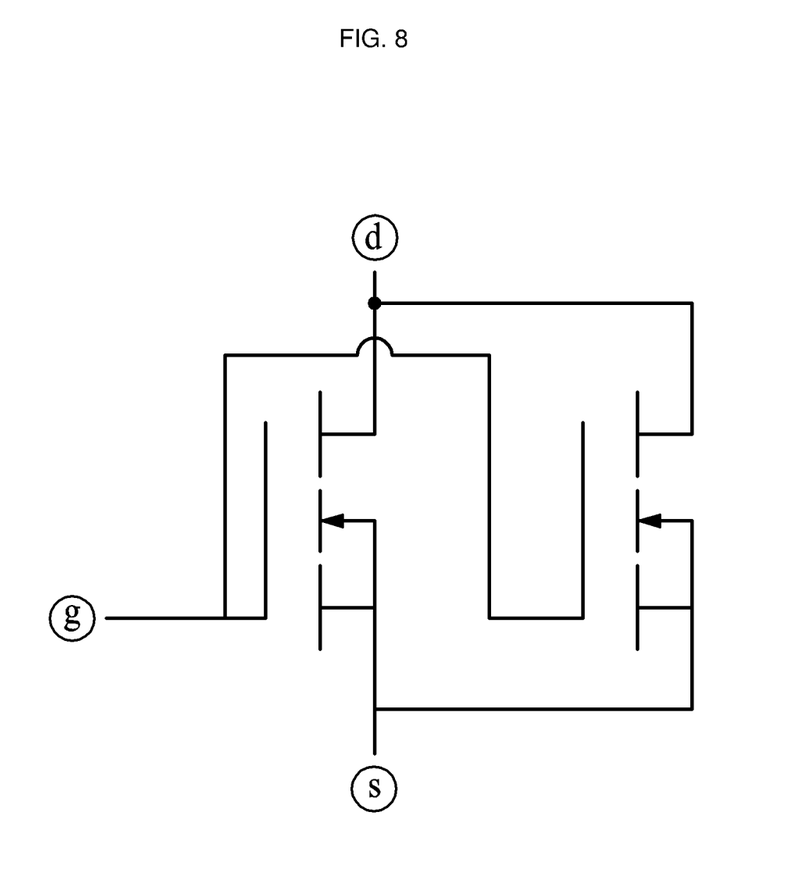
Figure 9:
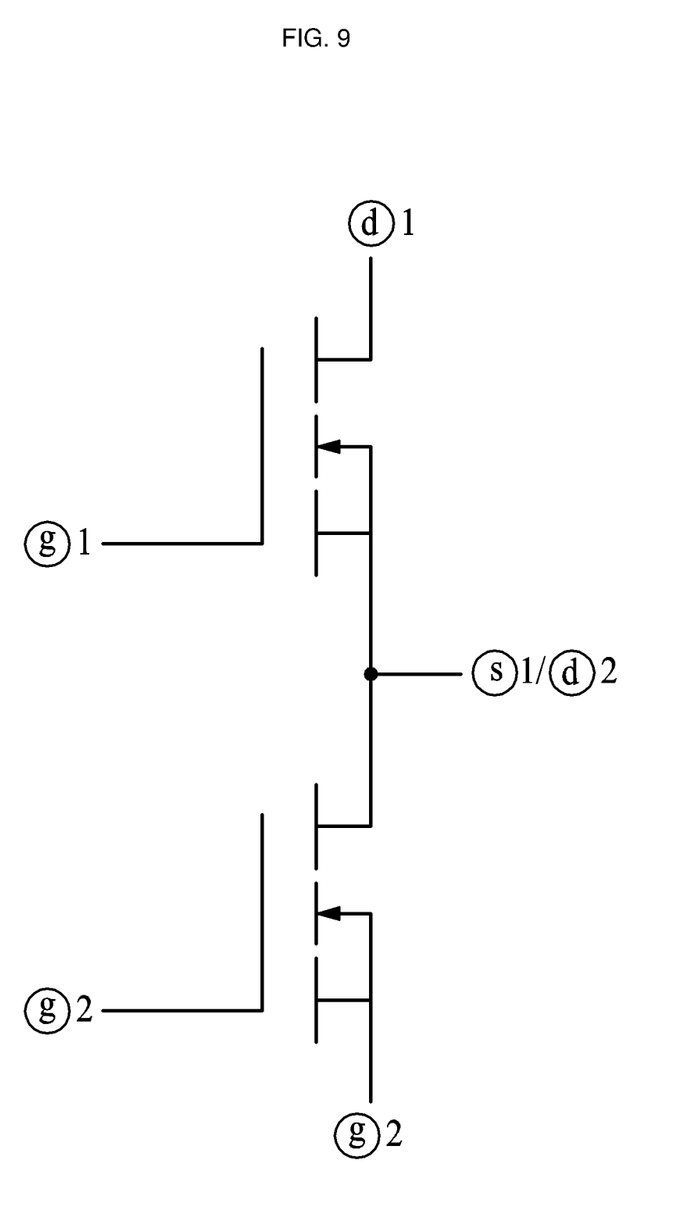

FIG. 4 is a view of the semiconductor package device having a single semiconductor chip located on a lead frame pad, according to an example. FIG. 5 is a view of the semiconductor package device having two semiconductor chips located on a lead frame pad, according to an example. FIG. 6 is a view of the semiconductor package device in which two semiconductor chips are located on a lead frame pad to form a half bridge circuit, according to an example. FIGS. 7 to 9 are views respectively illustrating equivalent circuits of the semiconductor package device structures shown in FIGS. 4 to 6, according to the corresponding examples.

The semiconductor package devices shown in FIGS. 4 and 5 differ from each other in terms of the number of the semiconductor chips 110 located on the lead frame pad 120-3, and their lead frame structures are otherwise the same. If the two identical semiconductor chips are used as in the example of FIG. 5, a rated current for the semiconductor chip 110 is able to be increased by two times with respect to the same voltage.

The solder 160 is applied onto the lead frame pad 120-3 shown in the examples of FIGS. 4 to 6, and the semiconductor chip 110 is located on the lead frame pad 120-3 with the solder 160 applied in such a manner. A material having high conductivity and wettability, and whose melting point is greater than or equal to 150 degrees Celsius may be used as the solder 160. In an example, a material for use as the solder 160 includes tin (Sn) series paste or silver (Ag) paste. In the example of a power semiconductor chip, the chip area is relatively wide so that voids are prone to be created in the solder 160. If voids are created in this manner, heat is concentrated at the voids, which have poor thermal conductivity, to thereby destroy the semiconductor chip 110. Thus, it is useful to establish the conditions, such as a temperature, time, and so on, for the chip placement process in an effective manner to prevent such destructive voids from being created. Voids are able to be reduced by maintaining a vacuum status using a vacuum facility, while the solder is being melted. After applying and curing the mold member 150, trimming is performed along the cutting lines 410, 510, 610, as shown in the examples of FIGS. 4 to 6, to eliminate the outer portions of the mold member 150. For example, the portions of the lead frame 120 that are to be exposed outside from the semiconductor package device 100 may be plated. Plating the above portions of the lead frame 120 is potentially advantageous in terms of anti-oxidation and improved solder joint reliability. In such an example, copper (Cu) is used as a material for the lead frame 120, and nickel (Ni) is used as a material for the plating, but these are only examples and other materials with similar properties are used in other examples.

Referring to the examples of FIGS. 4 and 5, the first lead frame leads 120-4, which are the portions indicated by ⓓ in FIGS. 4 and 5, are connected to the lead frame pad 120-3 to be connected to a drain of the semiconductor chip 110. The second lead frame leads 120-5, which are the portions indicated by ⓢ and ⓖ in FIGS. 4 and 5, are separated from the lead frame pad 120-3. The second lead frame leads indicated by ⓢ, from among the second lead frame leads 120-5, are connected to a source of the semiconductor chip 110, and the second lead frame leads, indicated by ⓖ from among the second lead frame leads 120-5, are connected to a gate of the semiconductor chip 110. In this manner, either a single chip or a parallel chip is constructed. Equivalent circuits of such single and parallel chips are illustrated in FIGS. 7 and 8, below, respectively.

Referring to the example of FIG. 6, the lead frame pad 120-3 has electrically separated portions, that is, a first lead frame pad 120-6 and a second lead frame pad 120-7. In such an example, the semiconductor chips 110-1, 110-2 are placed on the first lead frame pad 120-6 and the second lead frame pad 120-7, respectively. The first lead frame leads indicated by ⓓ1, from among the first lead frame leads 120-4, are connected to the first lead frame pad 120-6, and the remaining first lead frame leads, indicated by ⓓ2, are connected to the second lead frame pad 120-7. The second lead frame leads, indicated by ⓖ1 from among the second lead frame leads 120-5, are connected to a gate of the semiconductor chip 110-1 located on the first lead frame pad 120-6, and the second lead frame leads, indicated by ⓖ2, are connected to a gate of the semiconductor chip 110-2 located on the second lead frame pad 120-7. The second lead frame leads, indicated by ⓢ1 from among the second lead frame leads 120-5 are connected to a source of the semiconductor chip 110-1 located on the first lead frame pad 120-6, and the second lead frame leads, indicated by ⓢ2, are connected to a source of the semiconductor chip 110-2 located on the second lead frame pad 120-7. Referring to the center portion at the left side of FIG. 6, one of the first lead frame leads 120-4, as indicated by ⓓ2, is shown as being connected to one of the second lead frame leads 120-5, as indicated by ⓢ1. In this way, a half bridge circuit is constructed. An equivalent circuit of such a half bridge circuit is illustrated in the example of FIG. 9.

Figure 10:
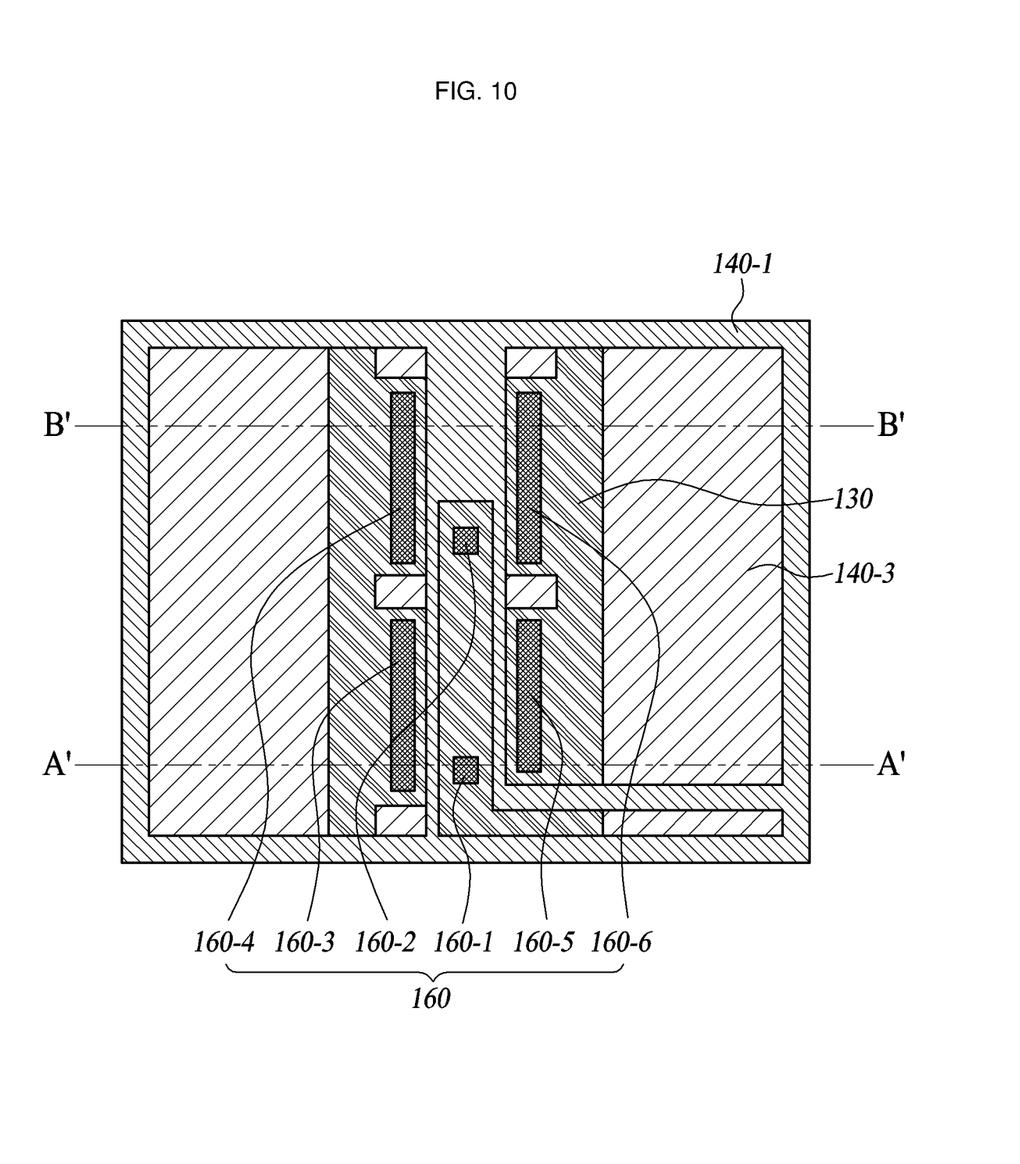
FIG. 10 is a view of the semiconductor package device having one or two semiconductor chip located on a lead frame pad, as viewed in a direction indicated by the arrow A in FIG. 1 to illustrate a substrate, a solder resist layer and a solder in the semiconductor package device, according to an example.
Figure 11:
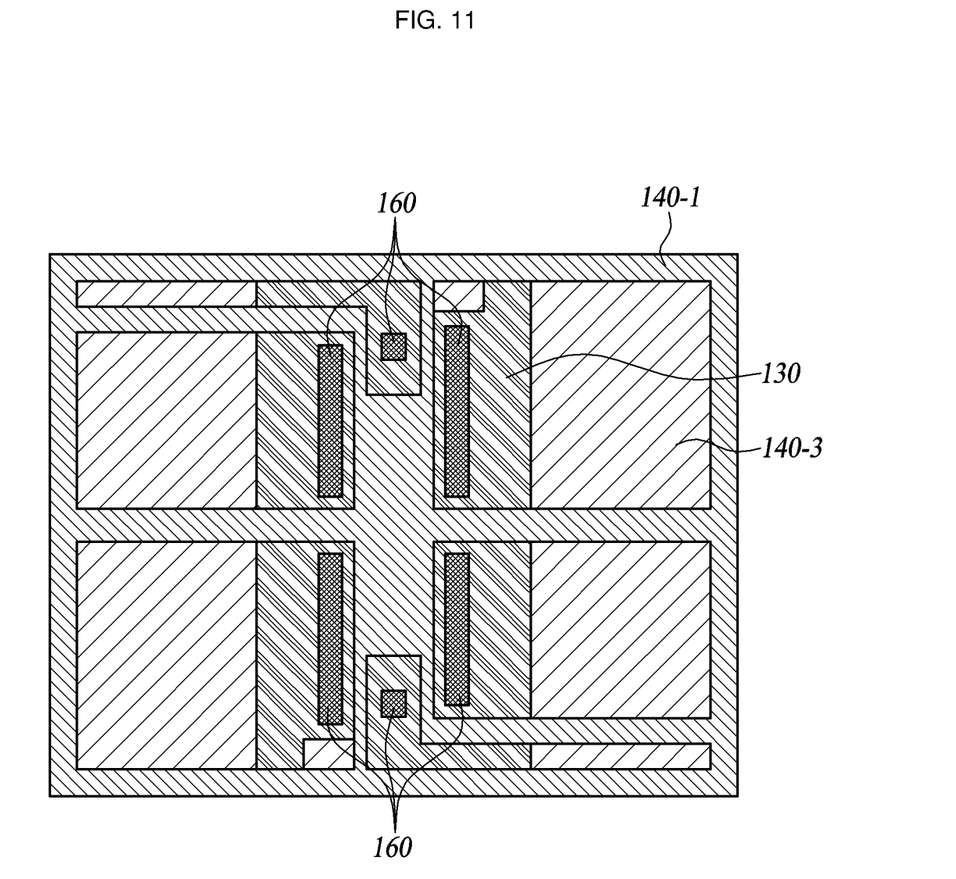
FIG. 11 is a view of the semiconductor package device formed to function as a half bridge circuit, as viewed in a direction indicated by the arrow A in FIG. 1 to illustrate a substrate, a solder resist layer and a solder in the semiconductor package device, according to an example.

FIG. 10 is a view of the semiconductor package device having one or two semiconductor chips located on a lead frame pad, as viewed in a direction indicated by the arrow A in the example of FIG. 1, to illustrate a substrate, a solder resist layer and a solder in the semiconductor package device, according to an example. FIG. 11 is a view of the semiconductor package device formed to function as a half bridge circuit, as viewed in a direction indicated by the arrow A in the example of FIG. 1 to illustrate a substrate, a solder resist layer and a solder in the semiconductor package device, according to an example. By applying the solder 160 to the substrate 140 as shown in the examples of FIGS. 10 and 11 and combining the semiconductor chip 110 attached to the lead frame 120 with the substrate 140 via the jig, a semiconductor package is produced accordingly.

While the example of FIG. 10 illustrates the second conductive layer 140-3 of the substrate 140 as extending vertically over a long length, the example of FIG. 11 illustrates the second conductive layer 140-3 of the substrate 140 as being divided into two portions. By dividing the second conductive layer 140-3 of the substrate 140 into two portions as in the example of FIG. 11 and configuring the lead frame 120 as in the example of FIG. 6, it is possible to produce a half bridge circuit. Referring to the example of FIG. 10, the second conductive layer 140-3 is placed in an abutting relationship with the insulating layer 140-1. Etching is performed on several portions of the second conductive layer 140-3, to separate portions to be connected to the source of the semiconductor chip 110, from portions to be connected to the gate of the semiconductor chip 110. Subsequently, the solder resist 130 is dispensed on the second conductive layer 140-3, except the portions to be connected to the source and gate of the semiconductor chip 110, as illustrated in the example of FIG. 10, with additional reference to FIG. 1. In such an example, the solder 160 is dispensed on the portions to be connected to the source and gate of the semiconductor chip 110. Thus, the solder 160-1, 160-2 is connected to the gate of the semiconductor chip 110, and the remaining solder 160-3, 160-4, 160-5, 160-6 is connected to the source of the semiconductor chip 110.

Figure 12:
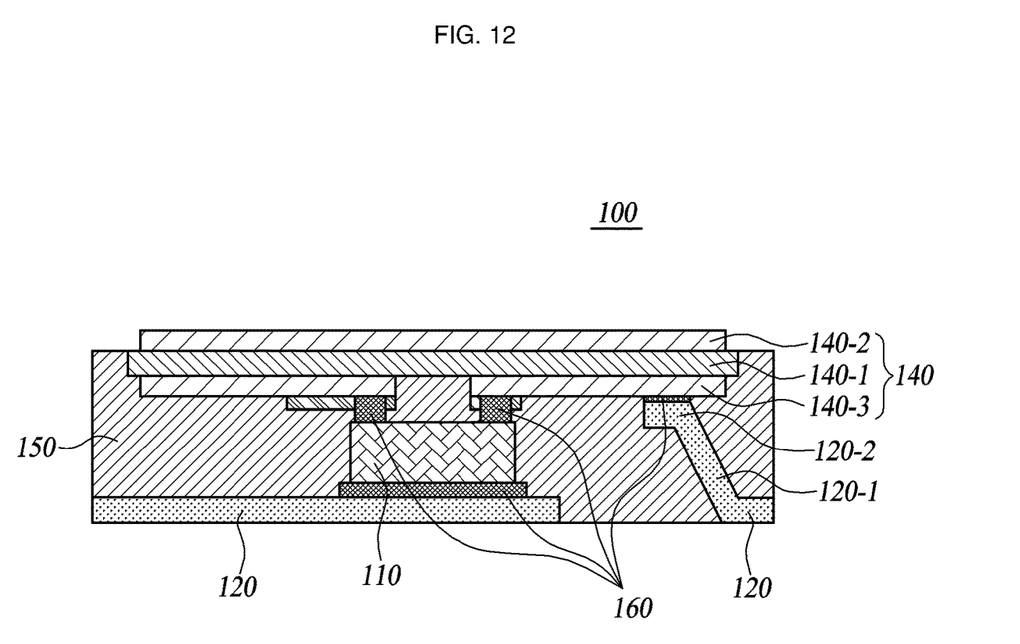
FIG. 12 is a sectional view of the semiconductor package device taken along the line B'-B' in FIG. 10, according to an example.

A sectional view of the semiconductor package taken along the line A'-A' in FIG. 10 is equivalent to the view shown in the example of FIG. 1, and a sectional view of the semiconductor package taken along the line B'-B' in FIG. 10 is shown in the view shown in the example of FIG. 12. The sectional views of the examples of FIGS. 1 and 12 differ from one another in that the solder 160-1 connected to the gate of the semiconductor chip 110 is present in the center portion of the device 100 in the example of FIG. 1, but such a solder is not shown in the example of FIG. 12. The sectional views of the examples of FIGS. 1 and 12 also differ in that while the slanted portion 120-1 and the bent portion 120-2 appear on the left portion of the device 100 in the example of FIG. 1, the example of FIG. 12 illustrates the slanted portion 120-1 and the bent portion 120-2 as being located on the right portion of the device 100. This property of the example of FIG. 12 is because the second lead frame leads 120-5 separated from the lead frame pad 120-3 in the example of FIG. 1, corresponding to the second lead frame leads positioned on the left side and indicated by ⓢ in FIGS. 4 and 5, are different from the second lead frame leads 120-5 separated from the lead frame pad 120-3 in the example of FIG. 12 (corresponding to the second lead frame leads positioned on the right side and indicated by ⓖ in FIGS. 4 and 5.

According to the examples disclosed herein, it is possible to provide a surface-mount type semiconductor package device having a lead frame, a semiconductor chip, a DBC substrate, and so on, stacked together that has improved heat dissipation and insulation capabilities as compared to alternative technologies. According to the disclosed examples, it is also possible to provide a surface-mount type semiconductor package device having low stray impedance, for example, low drain-to-source impedance, by directly connecting the semiconductor chip to the lead frame without using wires.

In the embodiments disclosed herein, the arrangement of the illustrated components may vary depending on an environment or requirements to be implemented. For example, some of the components may be omitted or several components may be integrated and implemented together. In addition, the arrangement order of some of the components can be changed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package device, comprising:
   a lead frame comprising a lead frame pad and lead frame leads;
   a semiconductor chip located on the lead frame pad; and
   a substrate located on the semiconductor chip,
   wherein the lead frame leads comprise:
      first lead frame leads coupled to the lead frame pad, and
      second lead frame leads separated from the lead frame pad and attached to a lower conductive layer of the substrate connected to a source and a gate of the semiconductor chip, and
   wherein the substrate comprises a direct bonded copper (DBC) substrate comprising a first conductive layer, an insulating layer and the lower conductive layer.

2. The device of claim 1, wherein the insulating layer is formed of either one or both of aluminum nitride (AlN) and aluminum oxide ($Al_2O_3$).

3. The device of claim 1, wherein either one or both of the first conductive layer and the second conductive layer is formed of copper (Cu).

4. The device of claim 1, further comprising a heat sink located on the substrate.

5. The device of claim 1, further comprising a mold member surrounding the semiconductor chip and the substrate.

6. The device of claim 1, wherein each of the second lead frame leads comprises a slanted portion and a bent portion, the slanted portion is inclined at an angle with respect to the lead frame pad, and the bent portion extends in a substantially parallel relationship to the lower conductive layer of the substrate.

7. The device of claim 6, wherein the lead frame pad comprises electrically separated portions, and semiconductor chips are located respectively on the electrically separated portions of the lead frame pad, and
   wherein one of the first lead frame leads is connected to one of the second lead frame leads.

8. The device of claim 6, wherein the angle at which the slanted portion is inclined is proportional to a height of the semiconductor chip.

9. The device of claim 8, wherein the angle at which the slanted portion is inclined is an angle ranging from 10 degrees to 90 degrees.

10. The device of claim 1, further comprising a solder resist layer interposed between the semiconductor chip and the substrate.

11. The device of claim 10, wherein the lead frame pad is attached to the lower conductive layer of the semiconductor chip by a solder paste.

12. The device of claim 10, wherein bent portions of the second lead frame leads are attached to the lower conductive layer of the substrate by a solder paste.

13. The device of claim 10, wherein the solder resist layer is formed using a photoimageable solder resist (PSR).

14. The device of claim 10, wherein the solder resist layer is attached to the lower conductive layer of the substrate by a solder adhesive or a polymeric adhesive.

15. The device of claim 14, wherein the polymeric adhesive comprises a silver-epoxy (Ag-epoxy) adhesive.

16. A semiconductor package device, comprising:
    a lead frame comprising a lead frame pad and lead frame leads, the lead frame pad comprising electrically separated portions;
    semiconductor chips located, respectively, on the electrically separated portions of the lead frame pad; and
    a substrate comprising a lower conductive layer and located on the semiconductor chips,
    wherein the lead frame leads comprise:
       first lead frame leads coupled to the lead frame pad, and
       second lead frame leads separated from the lead frame pad and attached to the lower conductive layer of the substrate connected to a source and a gate of each of the semiconductor chips,
    wherein each of the second lead frame leads comprises a slanted portion and a bent portion, the slanted portion is inclined at an angle with respect to the lead frame pad, and the bent portion extends in a substantially parallel relationship to the bottom surface of the substrate and is attached to the bottom surface of the substrate, and
    wherein one of the first lead frame leads is connected to one of the second lead frame leads.

17. A semiconductor package device, comprising:
    a lead frame comprising a lead frame pad and lead frame leads;
    semiconductor chips located on a first plane of the lead frame pad; and
    a substrate located on the semiconductor chips, comprising a first conductive layer, an insulating layer, and a second conductive layer;
    wherein the lead frame leads comprise:
       first lead frame leads coupled to the lead frame pad, and
       second lead frame leads separated from the lead frame pad and attached to the second conductive layer of the substrate connected to a source and a gate of each of the semiconductor chips, and
    wherein the lead frame pad and the first lead frame leads are located on the first plane and the second lead frame leads are located on a second plane.

18. The device of claim 17, wherein the insulating layer is formed of either one or both of aluminum nitride (AlN) and aluminum oxide ($Al_2O_3$).

19. The device of claim 17, wherein either one or both of the first conductive layer and the second conductive layer is formed of copper (Cu).

20. The device of claim 17, wherein the substrate is a direct bonded copper (DBC) substrate comprising the first conductive layer, the insulating layer, and the second conductive layer.

21. A semiconductor package device, comprising:
- a lead frame comprising a lead frame pad and lead frame leads;
- a semiconductor chip located on the lead frame pad;
- a substrate comprising a lower conductive layer and located on the semiconductor chip;
- a solder interposed between the semiconductor chip and the substrate to connect the lower conductive layer of the substrate with a source and a gate of the semiconductor chip; and
- a solder resist layer attached to the lower conductive layer, wherein the lead frame leads comprise:
  - first lead frame leads coupled to the lead frame pad, and
  - second lead frame leads separated from the lead frame pad and attached to the lower conductive layer of the substrate connected to the source and gate of the semiconductor chip.

22. The device of claim 21, wherein the solder resist layer is a patterned solder resist layer.

23. The device of claim 21, wherein a horizontal length of the lower conductive layer is longer than a horizontal length of the solder resist layer.

24. The device of claim 21, wherein the lower conductive layer is divided into two portions.

* * * * *